United States Patent [19]

Campardo et al.

[11] Patent Number: 5,541,880
[45] Date of Patent: Jul. 30, 1996

[54] REFERENCE SIGNAL GENERATING METHOD AND CIRCUIT FOR DIFFERENTIAL EVALUATION OF THE CONTENT OF NONVOLATILE MEMORY CELLS

[75] Inventors: Giovanni Campardo, Bergamo; Marco Dallabora, Carpiano, both of Italy

[73] Assignee: SGS-Thomson Microelectronics S.r.l., Agrate Brianza, Italy

[21] Appl. No.: 411,904

[22] Filed: Mar. 28, 1995

[30] Foreign Application Priority Data

Mar. 28, 1994 [EP] European Pat. Off. .............. 94830143

[51] Int. Cl.$^6$ ................................ G11C 7/00; G05F 3/20
[52] U.S. Cl. .................... 365/189.09; 365/210; 365/226; 327/540; 327/543; 323/313
[58] Field of Search ........................... 365/189.09, 227, 365/226, 210; 327/540, 543; 323/313

[56] References Cited

U.S. PATENT DOCUMENTS

| | | | |
|---|---|---|---|
| 4,943,948 | 7/1990 | Morton | 365/201 |
| 5,003,203 | 3/1991 | Win et al. | 365/189.09 X |
| 5,267,202 | 11/1993 | Dallabora et al. | 365/189.09 |
| 5,331,599 | 7/1994 | Yero | 365/226 |
| 5,384,740 | 1/1995 | Etoh et al. | 365/189.09 |

FOREIGN PATENT DOCUMENTS

| | | | |
|---|---|---|---|
| 0487808A1 | 11/1990 | European Pat. Off. | G11C 16/06 |
| 0433989A2 | 2/1991 | European Pat. Off. | G11C 16/06 |
| 0412837A2 | 2/1991 | European Pat. Off. | G11C 16/06 |

OTHER PUBLICATIONS

Golla et al., "30–MSamples/s Programmable Filter Processor," *IEEE Journal of Solid–State Circuits*, vol. 25(6):pp. 1502–1509, Dec. 1990.

*Primary Examiner*—David C. Nelms
*Assistant Examiner*—Son Dinh
*Attorney, Agent, or Firm*—David V. Carlson; Harry K. Ahn; Seed and Berry

[57] ABSTRACT

To reduce the supply voltage of a nonvolatile memory, a read reference signal is generated having a reference threshold value ranging between the maximum permissible threshold value for erased cells and the minimum permissible threshold value for written cells. To avoid reducing the maximum supply voltage, the characteristic of the read reference signal is composed of two portions: a first portion, ranging between the threshold value and a predetermined value, presents a slope lower than that of the characteristic of the memory cells and a second portion, as of the predetermined value of the supply voltage, presents the same slope as the characteristics of memory cells. The shifted-threshold, two-slope characteristic is achieved by means of virgin cells so biased as to see bias voltages lower than the supply voltage.

22 Claims, 2 Drawing Sheets

REFERENCE SIGNAL GENERATING METHOD AND CIRCUIT FOR DIFFERENTIAL EVALUATION OF THE CONTENT OF NONVOLATILE MEMORY CELLS

TECHNICAL FIELD

The present invention relates to a reference signal generating method and circuit for differential evaluation of the content of nonvolatile memory, in particular flash-EEPROM memory, cells.

BACKGROUND OF THE INVENTION

As is known, comparison reading of the content of a memory cell is performed by comparing a quantity related to the current through the cell to be read with a similar electric quantity related to the current through a reference cell whose content is known. In the case of flash-EEPROM arrays, a similar comparison is frequently also made after erasing the array or part of it, to verify correct erasure and, if necessary, complete the erasure.

According to one solution widely used at present, to safely distinguish between an erased cell and a written cell, the reference cell, when biased to a predetermined read voltage, generates a reference current of a value between that of an erased cell and a written cell. For this purpose, an erased reference cell with a threshold equal to the typical threshold is used, and the reference cell circuitry is so designed that the I–V characteristic ($I_{DS}$–$V_{GS}$) of the reference cell has a lower slope than that of the array cells. In the above solution, the minimum evaluation (read or verify) voltage is the value at which the current in the erased cell having the maximum permissible threshold is nevertheless higher than the current in the reference cell. This concept is illustrated in FIG. 1 which shows the typical I–V characteristic of a UV, i.e., UV erased, array cell whose threshold depends solely on the fabrication process (curve A); the characteristic of the erased cell with the maximum permissible threshold (curve B); the characteristic of the reference cell (curve C); and the erase-verify voltage (line D), i.e., the voltage at which erase testing is performed to determine correct erasure of the cells (at the erase-verify voltage, cells with a current $I_{ds}$ greater than the corresponding reference cell are considered erased). As can be seen, the erase-verify voltage, 3.2 V, is slightly higher than the value at which the characteristic of the erased cell with the maximum threshold intersects the reference characteristic.

According to the above known solution, the erase-verify voltage also represents the minimum read voltage and hence the minimum supply voltage of the memory (which, for economy, is made equal to the read voltage). In the typical case shown, wherein the erased cell and the reference cell both have a 2 V threshold and the erase-verify voltage equals 3.2 V, the maximum-threshold erased cell has a threshold voltage of 2.5 V, and the minimum supply voltage also equals 3.2 V.

On the other hand, current demand is for a reduction in supply voltage as much as possible, to extend application of this type of memory to portable equipment and others requiring low-power consumption.

A reduction in supply voltage, however, cannot be achieved by simply reducing the erase-verify voltage (and hence shifting to the left the characteristic of the erased cell with the maximum permissible threshold), as this would also result in a leftward shift (towards lower values) of the bell describing the threshold voltage distribution of the array cells when erased. Leftward shifting of the bell would also result in the threshold of the more erased cells (left limit of the bell) being brought too close to zero or even to a negative value, thus resulting in depleted cells, i.e., cells which conduct current even when $V_{GS}=0$, and which would therefore be read even when not addressed, thus impairing the accuracy of the reading.

Provision must also be made for eliminating as much as possible the presence of cells not yet depleted but with a very low threshold (ranging between 0 and 1 V) which may be subject to hole injection during subsequent programming, thus impairing the oxide layer and hence the reliability of the array.

To at least partially solve the problem of depleted or very low threshold cells, processes are currently employed for recovering the depleted cells. In addition to increasing actual erasing time, however, reducing erase-verify voltage also increases the time it takes to recover the depleted cells, thus considerably increasing erasing time as a whole and reducing the speed of the memory.

SUMMARY OF THE INVENTION

It is an object of the present invention to provide a method and circuit permitting a reduction in supply voltage, without impairing reading or erase verify of the array cells or the reliability of the array itself.

According to the present invention, there are provided a reference signal generating method and circuit for differential evaluation of the content of nonvolatile memory cells, as claimed respectively in claims 1 and 7.

DETAILED DESCRIPTION OF THE INVENTION

Figure 2:
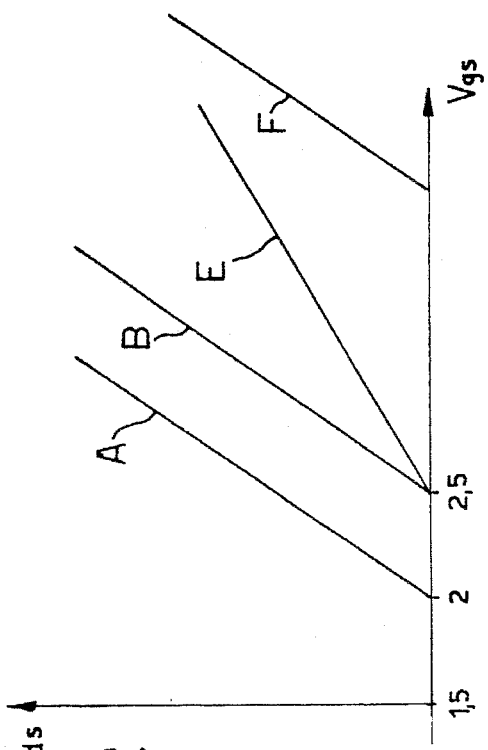
FIG. 2 shows a similar plot of the characteristics used for evaluating memory cells according to a first embodiment of the present invention.
Figure 1:
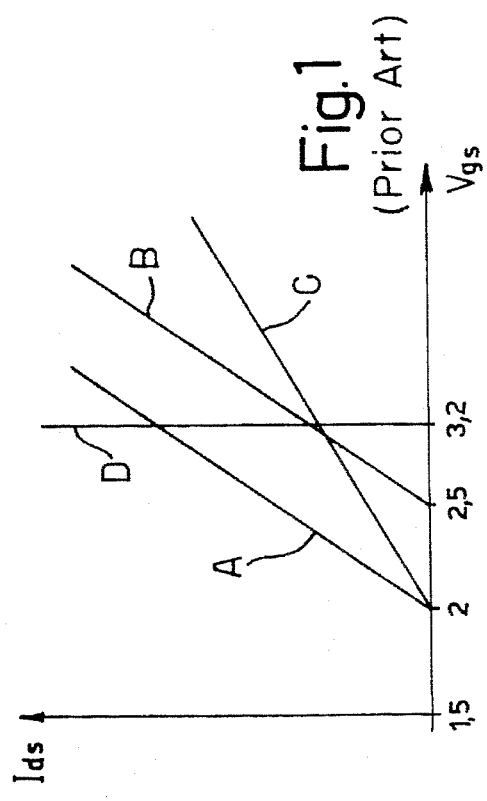
FIG. 1 shows the plot of the characteristics used for evaluating memory cells according to a known method.

FIG. 2 plot shows the I–V characteristic of the read and erase-verify reference voltage according to a first embodiment of the present invention. As shown in FIG. 2, the reference characteristic generated by the reference branch of the array is shifted with respect to the corresponding currently used characteristic (curve C in FIG. 1) so that its threshold (voltage at which current $I_{ds}$ is zero) is higher or at least the same as that of the erased cell with the maximum permissible threshold (curve B). For comparison purposes, FIG. 2 also shows the characteristic A of a typical UV erased cell.

Generation of reference characteristic E provides for reading and verifying the memory cells at a lower voltage as compared with known solutions, and hence for designing memories with a lower supply voltage.

For example, assuming the threshold of the erased cell with the maximum permissible threshold is 2.5 V and the read circuit is so designed that the reference cell threshold is also 2.5 V, even allowing for uncertainty as to the supply voltage (+10%), it is possible to work with a nominal supply voltage of no more than 3 V. Even in the event the supply voltage is the minimum permissible (2.7 V), the current through the reference cell at read voltage is lower than the current through any of the erased cells (including those with a maximum threshold, corresponding to characteristic B) and higher than the current through any of the written cells (characteristic F in FIG. 2).

Figure 3:
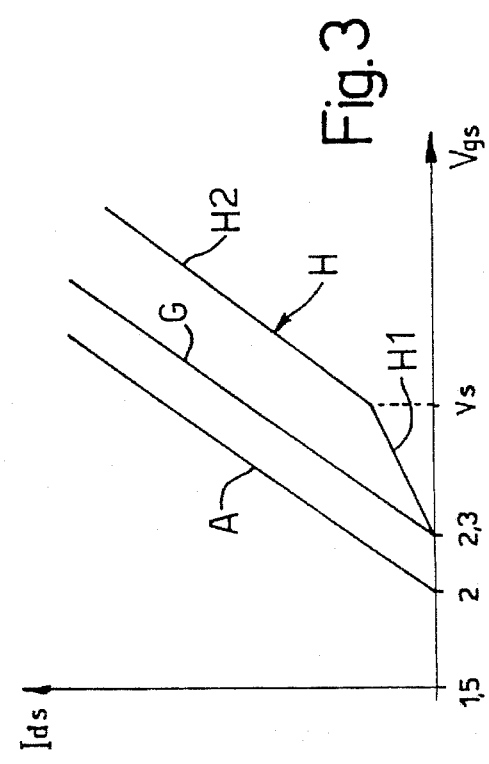
FIG. 3 shows a similar plot according to a second embodiment of the present invention.

Referring to FIG. 3, a second embodiment of the present invention is disclosed. For safer reading—in view of the narrow margin in the FIG. 2 solution between the threshold of the erased cell with the maximum permissible threshold and the minimum read voltage (200 mV, between 2.5 and 2.7 V)—the maximum threshold of the erased cells is reduced slightly, e.g., by 200 mV, to 2.3 V. Though this shifts the overall threshold distribution bell by 200 mV, the threshold reduction is so small as to bring about only a negligible impairment in terms of the percentage of depleted or pre-depleted cells (with a threshold of 0 to 1 V).

Moreover, an erase-verify reference characteristic (G in FIG. 3) substantially similar to that of a maximum-threshold erased cell (maximum erased cell characteristic) is provided. According to the above solution, therefore, the erase-verify reference characteristic no longer coincides with the read reference characteristic.

According to another embodiment of the present invention, the read reference characteristic H is no longer represented by a single straight line, but by a broken line formed of two segments: a first segment H1 extending between the x axis and a predetermined voltage $V_S$ (e.g., supply voltage $V_{CC}$); and a second segment H2 extending from the voltage $V_S$. More specifically, the first segment has a slope equal to a fraction of that of the array cell characteristics (e.g., ⅔, as in known characteristic C of FIG. 1); and the second segment has a slope equal to that of the array cell characteristics. The read reference characteristic according to the above embodiment is indicated by H in FIG. 3, and comprises a first segment H1 and a second segment H2.

By virtue of being divided into two segments, read reference characteristic H is in no danger of intersecting the characteristic of a written cell (F in FIG. 2) even in the event of a high read or supply voltage. This therefore eliminates the need to reduce the maximum supply voltage of those devices that do not require low read voltage for reasons of economy and in which a high read voltage (e.g., a nominal voltage of over 5 V) is preferable. In fact, without the above change in slope (characteristic E in FIG. 2), the maximum read voltage (and hence supply voltage) must be kept below that at which the read reference characteristic and the characteristic of the least written cell intersect.

Figure 4:
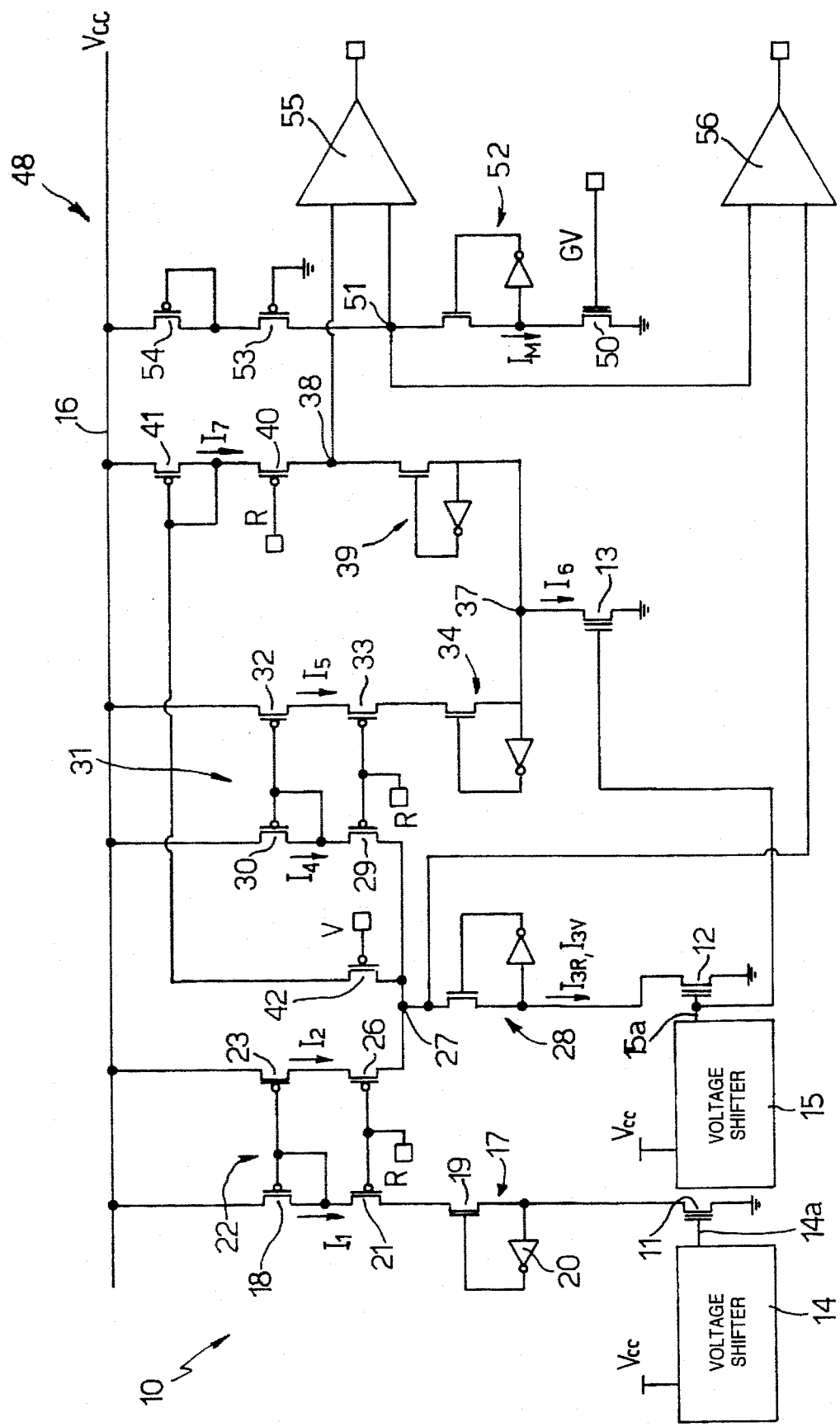
FIG. 4 shows a reference signal generating circuit in accordance with the present invention and corresponding to the FIG. 3 diagram.

One embodiment of a circuit for generating the read and erase-verify reference characteristics of FIG. 3 is shown in FIG. 4 and described below.

In FIG. 4, the generating circuit is indicated as a whole by 10 and comprises three flash type virgin cells 11, 12, 13 external to the memory array. Cells 11–13, which themselves have a threshold of 2 V, are so biased as to present a characteristic shifted with respect to the typical characteristic of a virgin cell, which bias is achieved by means of voltage shift elements 14 and 15 supplied at the input with supply voltage $V_{CC}$ and supplying a shifted voltage at the output. More specifically, voltage shifter 14 has an output 14a connected to the gate terminal of cell 11 and supplies a shifted voltage of, for example, 1 V, so that the gate-source voltage drop $V_{GS11}$ of cell 11 equals $V_{CC}$-1 V, and cell 11 has a threshold of 3 V (supply voltage value at which cell 11 begins conducting). Voltage shifter 15 in turn has an output 15a connected to the gate terminals of cells 12 and 13 and supplies a shifted voltage of, say, 300 mV, so that the gate-source voltage drop ($V_{GS12}$, $V_{GS13}$) of cells 12 and 13 equals $V_{CC}$-0.3 V, and cells 12, 13 both have a threshold of 2.3 V.

Cell 11 is connected to a precharge circuit 17 and a load transistor 18. Precharge circuit 17, of known type, comprises an N-channel MOS transistor 19 with the source terminal connected to the drain terminal of cell 11, the gate terminal connected to the output of an inverter 20, and the drain terminal connected to transistor 18. The input of inverter 20 is connected to the source terminal of transistor 19 to bias the drain terminal of cell 11 to a fixed voltage, e.g., 1 V, in known manner.

Between precharge circuit 17 and load transistor 18, there is inserted a switch 21 formed by a P-channel MOS transistor supplied at the gate terminal with a logic signal R for enabling cell 11 in read mode.

Load transistor 18 is a diode-connected PMOS type with the source terminal connected to $V_{CC}$ supply line 16, and the drain terminal connected to transistor 21. Transistor 18 is a resistive type with a size (width/length) ratio W/L of, for example, 10/2, and forms part of a current mirror circuit 22 including another P-channel MOS transistor 23 of the same size as transistor 18. Transistor 23 has the source terminal connected to supply line 16, the gate terminal connected to the gate terminal of transistor 18, and the drain terminal connected to the source terminal of a PMOS type transistor 26 operating as a switch whose gate terminal is supplied with logic signal R, and whose drain terminal is connected to a node 27.

Node 27 is connected to the drain terminal of cell 12 via a precharge circuit 28 similar to circuit 17 and therefore is not described in detail. The source terminal of cell 12 is grounded, and node 27 is also connected to the drain terminal of a PMOS type switch transistor 29, the gate terminal of which is supplied with logic signal R, and the source terminal of which is connected to the drain terminal of a resistive type load transistor 30 forming part of a second current mirror circuit 31. More specifically, P type MOS transistor 30 is diode-connected, has the source terminal connected to supply line 16, has a smaller W/L ratio than transistors 18, 23, e.g., 10/4, and is therefore more resistive than transistors 18, 23, as explained hereinbelow.

Current mirror circuit 31 also comprises a PMOS transistor 32 of the same size as transistor 30, and with the source terminal connected to supply line 16, the gate terminal connected to the gate terminal of transistor 30, and the drain terminal connected to the source terminal of a PMOS switch transistor 33, the gate terminal of which is supplied with logic signal R, and the drain terminal of which is connected to a precharge circuit 34 similar to circuits 17 and 28.

Precharge circuit 34 is interposed between switch transistor 33 and a node 37 which is also connected to the drain terminal of cell 13, the source terminal of which is grounded.

Node 37 is also connected to a read reference node 38 via a precharge circuit 39 similar to circuits 17, 28, 34; and node 38 is connected to supply line 16 via a switch transistor 40 and a load transistor 41. More specifically, switch transistor 40 is a PMOS type supplied with logic signal R at the gate terminal; and load transistor 41 is a resistive PMOS type with the same size ratio as transistors 18, 23, e.g., 10/2. Transistor 41 is diode-connected, and has the drain terminal connected to switch 40 and to its own gate terminal, the source terminal connected to line 16, and the gate terminal connected to node 27 via a PMOS type switch transistor 42, the gate terminal of which is supplied with a logic erase-verify enabling signal V.

FIG. 4 also shows a branch of a memory array 48 and the comparators for comparing the array data and reference data. More specifically, the memory array 48 shows a cell 50 with a grounded source terminal, the gate terminal supplied with a bias voltage GV, and the drain terminal connected to a node 51 via a precharge circuit 52 similar to circuit 17. Node 51 is connected to supply line 16 via a switch transistor 53 and a load transistor 54 similar in size to elements 40, 41 of the reference portion of the circuit. Unlike transistor 40, however, switch transistor 53 has a grounded gate terminal so that it is always on (closed switch).

Reference node 38 and array node 51 are connected to respective inputs of a first comparator 55 for comparing the voltages at said nodes in read mode, which voltages depend in known manner on the currents through reference cell 13 and memory cell 50.

Reference node 27 and array node 51 are connected to respective inputs of a second comparator 56 for comparing the voltages at said nodes in erase-verify mode.

Operation of the FIG. 4 circuit will now be described with reference also to FIG. 5 which, as circuit 10 may be used for memory arrays operating at various supply voltages, shows the characteristics of the major circuit nodes as a function of supply voltage.

As already stated, by virtue of voltage shifters 14 and 15, cells 11, 12, 13 have lower gate-source voltages $V_{GS}$ with respect to supply voltage, but their characteristic also depends on the working load as will be explained hereinbelow wherein $I_1$ is the current through load transistor 18 (and cell 11), $I_2$ the current through mirror transistor 23, $I_{3R}$ the current through cell 12 in read mode, $I_{3V}$ the current through cell 12 in erase-verify mode, $I_4$ the current through load transistor 30, $I_5$ the current through mirror transistor 32, $I_6$ the current through cell 13, and $I_7$ the current through load transistor 41.

In read mode, logic signal R is low and logic signal V high, so that switches 21, 26, 29, 33, 40 are closed (transistors on), switch 42 is open, and, as long as supply voltage $V_{CC}$ is below 2.3 V, cells 11, 12, 13 are off ($V_{GS11}$<1.3 V, $V_{GS12}$=$V_{GS13}$<2 V). Upon supply voltage exceeding 2.3 V, cells 12 and 13 begin conducting, but their characteristic presents a less than typical slope due to the loads being present. In the 2.3 to 3 V supply voltage range, cell 11 is off, $I_1$ and hence $I_2$ are zero, and cell 12 only conducts the current supplied by load transistor 30 which, being highly resistive, limits the supplied current. More specifically, with the above sizing, the slope of characteristic $I_{3R}$ (shown by $I_{3R}$ in FIG. 5) is roughly half that of the intrinsic characteristic of cells 11–13 (shown by $I_v$ in FIG. 5), so that $I_4=I_{3R}$ and $I_5=I_4$ due to transistors 30, 32 forming a 1:1 mirror.

Figure 5:
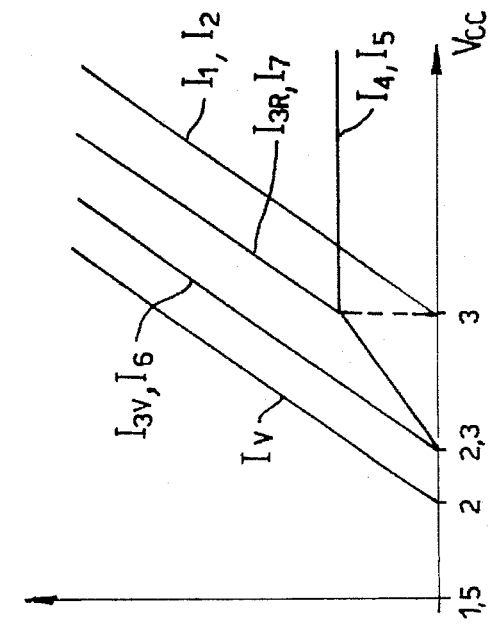
FIG. 5 shows a plot of a number of characteristics obtainable as a function of supply voltage at predetermined points of the FIG. 4 circuit.

Within the same supply voltage range, current $I_6$ through cell 13 has the intrinsic curve characteristic, as shown in FIG. 5, because current through the cell 13 is being supplied by both load transistors 32 and 41; and current $I_7$ through load transistor 41, the value of which equals $I_6-I_5$, has a slope equal to half the intrinsic slope of cells 11, 12, 13, as shown in FIG. 5.

With a supply voltage of over 3 V, circuit 10 operates differently. Cell 11 is now turned on by having a $V_{GS}$ voltage of over 2 V, and draws a current $I_1$ with the curve as shown in FIG. 5, i.e., with a 3 V threshold and the same slope as a virgin cell with no current limitation ($I_v$). Due to the 1:1 ratio of mirror 22, $I_2=I_1$, and at this point the current through cell 12 is no longer limited by the high resistivity of load transistor 30 by virtue of cell 12 also seeing load transistor 23. Consequently, current $I_{3R}$ increases alongside the supply voltage with a slope equal to the intrinsic slope, and $I_4$ (the value of which equals $I_{3R}-I_2$) presents a constant curve, as does $I_5$ which equals $I_4$.

Current $I_6$ maintains the curve governed by the shifted characteristic of cell 13, while $I_7$, the value of which still equals $I_6-I_5$, in this case presents the same slope as a virgin cell.

In the example shown, $I_{3R}=I_7$ due to the specific sizing of load transistors 18, 23, 30, 32, 41, though in general this does not occur.

In known manner, the voltages at nodes 38 and 51 depend solely on currents $I_7$ and $I_M$ (the current in cell 50 with characteristic A or F in FIG. 2, depending on whether cell 50 is erased or written) and may therefore be compared directly to safely determine the state of cell 50 even in the presence of low supply voltages.

Conversely, in erase-verify mode, logic signal R is high and signal V low, so that switches 21, 26, 29, 33, 40 are open and switch 42 closed, thus connecting node 27 directly to the drain terminal of load transistor 41.

In this mode, cell 12 operates like a virgin cell with a shifted characteristic (2.3 V threshold) and unlimited slope (in this mode, at any work point, cell 12 sees the same load 41), so that the characteristic of cell 12 ($I_{3V}$) coincides with characteristic $I_6$ in FIG. 5.

As such, comparator 56 may compare the voltage at node 27 (again related solely to current $I_{3V}$) with the voltage at node 51 to determine whether cell 50 is sufficiently erased.

The advantages of the method and circuit described are many. One advantage is that they provide for reading and erase-verifying the memory cells even in the presence of low supply voltage, in particular as low as a nominal voltage of 3 V; and, when the erase threshold is shifted slightly downwards, the method according to the invention provides for a good safety margin, thus ensuring highly reliable reading of the cells even with a low supply voltage.

Another advantage is that providing a read reference characteristic with two slopes—a lower slope in the low-voltage range followed by a higher slope—enables use of the same method and circuit for high-voltage storage devices as well, so that the same structure may be used for different applications, thus reducing design, fabrication and storage costs.

The circuit described is also extremely reliable. In particular, the use of virgin cells with a characteristic shifted by means of voltage shifters is especially advantageous, in that virgin cells provide for a high degree of even long-term precision and hence a high degree of stability of the circuit, unlike, for example, the use of even only partly written cells which, by their nature, tend eventually to discharge resulting in an unwanted intrinsic characteristic drift. Moreover, virgin cells present an intrinsically "safe" threshold involving no uncertainty (unlike, for example, erased cells which, as described above, present a statistic distribution of the threshold value). The use of virgin cells therefore eliminates or at least simplifies complex, high-cost matching of the reference cell threshold.

Clearly, changes may be made to the method and circuit as described and illustrated herein without, however, departing from the scope of the present invention. In particular, the circuit arrangement of the bias branches of cells 11–13 is purely indicative and may be modified in various respects. For example, as opposed to providing two comparators—one each for read and erase-verify—one comparator, e.g., 55, may be provided by connecting its reference input also to node 27 via a switch element. The sizes and voltage values are also purely indicative.

Finally, as opposed to using voltage shifters at the gate terminal of the reference cells for shifting the characteristic of the virgin memory cells, positive voltage offsets may be provided at the source terminals of the cells.

We claim:

1. A reference signal generating method for differential evaluation of the content of nonvolatile memory cells, the method comprising the steps of:

generating a read reference signal having an I–V characteristic, the slope of the I–V characteristic being lower, at least in one portion, than that of the I–V characteristic of the cells of said memory, the read reference signal having a reference threshold value ranging between a maximum permissible threshold value for erased cells and a minimum permissible threshold value for written cells.

2. A method as claimed in claim 1 wherein said step of generating a read reference signal comprises the steps of using a virgin cell and shifting its characteristic to said reference threshold value.

3. A method as claimed in claim 2 wherein said step of shifting said characteristic comprises the step of generating, between two terminals of said virgin cell, a bias voltage lower than the read voltage of the cells of said nonvolatile memory.

4. A method as claimed in claim 1, further comprising the step of generating an erase-verify reference signal having a characteristic equal to that of an erased cell with a maximum permissible threshold.

5. A method as claimed in claim 1, for a memory array supplied with a supply voltage wherein said step of generating a reference signal comprises the steps of:

biasing a reference cell having said reference threshold value, with a voltage related to said supply voltage;

limiting the current through said reference cell when said supply voltage presents a value ranging between said reference threshold value and a predetermined value greater than said reference threshold value, to generate a first characteristic portion with a lower slope than the characteristic of the cells of said memory; and supplying said reference cell with a current of such a value as to generate a second characteristic portion bending with and having a higher slope than said first portion, when said supply voltage presents a value greater than said predetermined value.

6. A method as claimed in claim 5 wherein said second characteristic portion presents a slope equal to that of the characteristic of the cells of said memory.

7. A reference signal generating circuit comprising:

a memory comprising a plurality of nonvolatile memory cells; and means for generating a read reference signal having an I–V characteristic, the slope of the I–V characteristic being lower, at least in one portion, than that of the I–V characteristic of the cells of said memory, wherein the read reference signal has a reference threshold value ranging between a maximum permissible threshold value for erased cells and a minimum permissible threshold value for written cells.

8. A circuit as claimed in claim 7, further comprising:

at least one virgin cell; and characteristic shifting means connected to said virgin cell, for shifting the characteristic of said virgin cell to said reference threshold value.

9. A circuit as claimed in claim 8 wherein said characteristic shifting means comprise a voltage shifter for generating, between two terminals of said virgin cell, a bias voltage lower than the read voltage of the cells of said nonvolatile memory.

10. A circuit as claimed in claim 7, further comprising:

verify source means for generating an erase-verify reference signal having a characteristic equal to that of an erased cell with a maximum permissible threshold.

11. A circuit as claimed in claim 7, for a memory array supplied with a supply voltage; said circuit comprising:

a first reference cell having said reference threshold value; and means for biasing said reference cell with a bias voltage related to said supply voltage wherein the means for biasing said reference cell comprises current limiting means for limiting the current through said first reference cell, when said supply voltage presents a value ranging between said reference threshold value and a predetermined value greater than said reference threshold value, according to a first characteristic portion having a lower slope than the characteristic of the cells of said memory, and current source means supplying said first reference cell so that the current in said reference cell follows a second characteristic portion bending with and having a higher slope than said first portion, when said supply voltage presents a value greater than said predetermined value.

12. A circuit as claimed in claim 11 wherein said first reference cell is a virgin cell, and wherein said biasing means comprise a voltage shifter connected between a supply line (16) and a control terminal of said first reference cell, for generating for said control terminal a first bias voltage lower than said supply voltage.

13. A circuit as claimed in claim 12 wherein said current source means comprises a first load circuit connected between said supply line and said reference cell, wherein the circuit further comprises means for enabling said load circuit when said supply voltage is greater than said predetermined value and wherein said current limiting means comprise a second load circuit connected parallel to and presenting a higher resistance with respect to said first load circuit.

14. A circuit as claimed in claim 13 wherein said second load circuit comprises a first MOS transistor having a first width/length ratio, and said first load circuit comprises a second MOS transistor having a second width/length ratio smaller than said first ratio.

15. A circuit as claimed in claim 13 wherein said enabling means comprises a second virgin reference cell having a control terminal; and a second voltage shifter connected between said supply line and said control terminal of said second reference cell, for generating a second bias voltage for said control terminal of said second reference cell, said second bias voltage being lower than said supply voltage and said first bias voltage.

16. A circuit as claimed in claim 13, further comprising:

a third load circuit connected parallel to said first and second load circuits and of the same resistance as said first load means;

first enabling means connected to said first and second load circuits, for enabling said first and second load circuits in memory read mode; and second enabling means connected to said third load circuit, for enabling said third load circuit in erase-verify mode.

17. A method of generating a reference signal for evaluating contents of non-volatile memory cells, the method comprising the steps of:

generating a read reference signal having a read reference I–V characteristic, the read reference I–V characteristic including a first portion having a positive slope, the first portion having a lower slope than the slope of an I–V characteristic of the memory cells; and providing a reference threshold value for the read reference signal between a maximum permissible threshold value for erased memory cells and a minimum permissible threshold value for written memory cells.

18. The method according to claim 17 further comprising the step of generating an erase-verify reference signal having a substantially similar I–V characteristic as an I–V characteristic of an erased memory cell with a maximum permissible threshold.

19. The method according to claim 17 wherein the read reference I–V characteristic includes a second portion, and the step of generating a read reference signal includes the step of generating the second portion of the read reference I–V characteristic of the read reference signal, the second portion extending from the first portion and having a higher slope than the slope of the first portion.

20. A reference signal generating circuit comprising:

a plurality of non-volatile memory cells for writing and erasing information stored therein; and a generator for generating a read reference signal to evaluate information contents of the memory cells, the read reference signal having a read reference I–V characteristic, the read reference I–V characteristic including a first portion having a positive slope, the first portion having a lower slope than the slope of an I–V characteristic of the memory cells, the read reference I–V characteristic also having a reference threshold value between a maximum permissible threshold value for erased memory cells and a minimum permissible threshold value for written memory cells.

21. The circuit according to claim 20 further comprising a second generator for generating an erase-verify reference signal having a substantially similar I–V characteristic as an I–V characteristic of an erased memory cell with a maximum permissible threshold.

22. The circuit according to claim 20 wherein the read reference I–V characteristic includes a second portion, and the generator generates the second portion of the read I–V reference characteristic of the read reference signal, the second portion extending from the first portion and having a higher slope than the slope of the first portion.

\* \* \* \* \*

UNITED STATES PATENT AND TRADEMARK OFFICE
CERTIFICATE OF CORRECTION

PATENT NO.    : 5,541,880
DATED         : July 30, 1996
INVENTOR(S)   : Giovanni Campardo et al.

It is certified that error appears in the above identified patent and that said Letters Patent is hereby corrected as shown below:

In column 7, claim 4, line 39, immediately following "of", please insert ":".

Signed and Sealed this

Nineteenth Day of November, 1996

Attest:

BRUCE LEHMAN

*Attesting Officer*            *Commissioner of Patents and Trademarks*